United States Patent [19]

Scala et al.

[11] Patent Number: 4,551,689
[45] Date of Patent: Nov. 5, 1985

[54] RF LOCAL OSCILLATOR WITH LOW PHASE NOISE

[75] Inventors: John Scala, Islip Terrance; William Reuter, Ronkonkoma, both of N.Y.

[73] Assignee: Comtech Telecommunications Corp., N.Y.

[21] Appl. No.: 469,636

[22] Filed: Feb. 25, 1983

[51] Int. Cl.$^4$ .............................................. H03L 7/00
[52] U.S. Cl. ........................................ 331/2; 331/25; 331/47
[58] Field of Search ........................ 331/2, 25, 30, 47; 375/120; 455/260

[56] References Cited

U.S. PATENT DOCUMENTS 4,114,110  9/1978  Nossen ................................... 331/2
4,191,930  3/1980  Harzer .................................... 331/2

OTHER PUBLICATIONS

Motoyama, H. "PLL Frequency Synthesizers to Replace Beat-Frequency Oscillators", JEE, (Jun. 1977), No. 126, pp. 37-40.

Astrof, K. L. "Frequency Synthesis in a Microwave signal Generator", Hewlett-Packard Journal (USA) (Nov. 1977), pp. 8-15.

Lewis, M., "A Compact Agile Microwave Frequency Generator for Radar Applications", Conference: Military Microwaves 78 Conference Proceedings, London, England, Oct. 25-27 1978, pp. 234-237.

Primary Examiner—Eugene R. LaRoche
Assistant Examiner—Robert J. Pascal
Attorney, Agent, or Firm—Brumbaugh, Graves, Donohue & Raymond

[57] ABSTRACT

An RF local oscillator, particularly useful in connection with phase shift key modulation in satellite communications systems, provides a low phase noise signal by use of a phase locked loop having a phase stable oscillator to provide frequency conversion of a frequency synthesizer output signal.

8 Claims, 6 Drawing Figures

4,551,689

RF LOCAL OSCILLATOR WITH LOW PHASE NOISE

FIELD OF THE INVENTION

This invention relates to radio frequency transmitters and receivers, and particularly to radio frequency (RF) local oscillators used in connection with transmitters and receivers.

In connection with communications systems, such as satellite communications systems, and particularly with such systems which use phase shift keying, such as quadrature phase shift keying (QPSK) modulation for transmission of digital data, it is frequently necessary to provide a local oscillator signal which has selectable frequency and a high degree of phase stability. Phase instability in the local oscillator signal can result in ambiguities and errors in transmitting or receiving a phase shift keyed signal. Accordingly, it is an object of the present invention to provide a frequency-agile local oscillator, particularly an RF local oscillator, which has a high degree of phase stability.

It is another object of the invention to provide such an RF local oscillator, which can be used with an existing frequency synthesizer and provide a degree of phase stability which was not available from the use of such synthesizers and RF local oscillators.

SUMMARY OF THE INVENTION

In accordance with the present invention there is provided and RF local oscillator which is responsive to a supplied reference signal for providing a signal at a selected higher frequency. The RF local oscillator includes a phase stable oscillator for providing a phase stable output signal having a frequency which is separated from the selected higher frequency by the frequency of the reference signal. There is provided a voltage controlled oscillator operating at a higher frequency and a phase locked loop responsive to the reference signal and the phase stable signal, and including the voltage controlled oscillator, for controlling the output of the voltage controlled oscillator to develop a signal at the higher frequency.

For a better understanding of the present invention, together with other and further objects, reference is made to the following description, taken in conjunction with the accompanying drawings, and its scope will be pointed out in the appended claims.

BACKGROUND OF THE INVENTION

Figure 1:
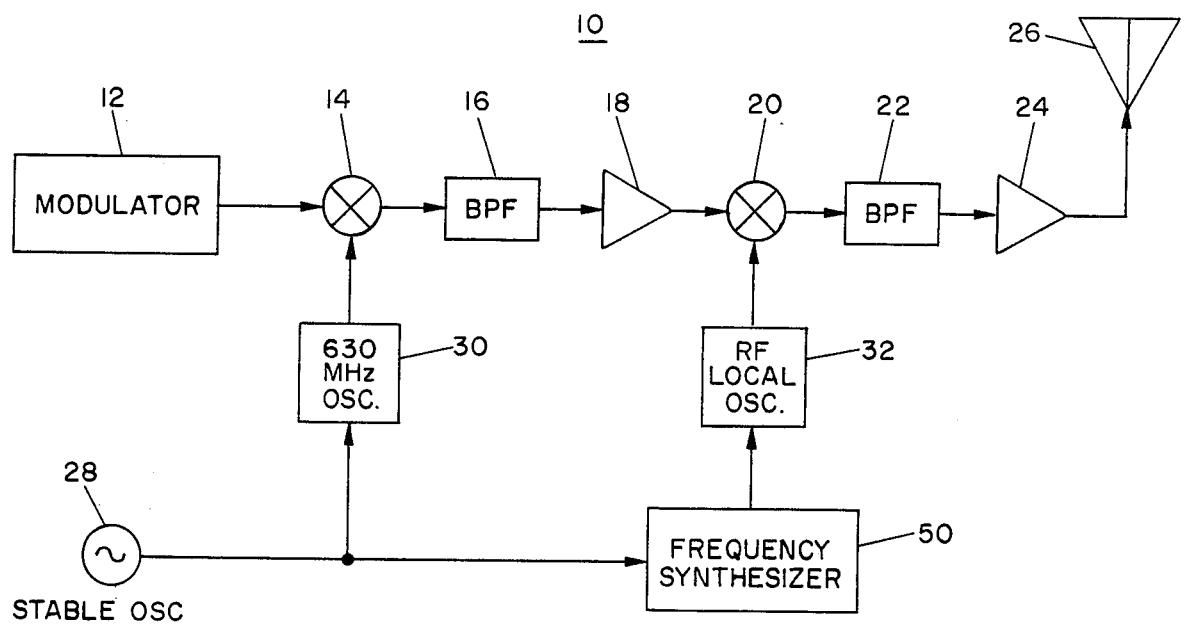
FIG. 1 is a schematic and block diagram of a transmitting system using an RF local oscillator.

FIG. 1 illustrates a transmitter 10, for example, a satellite communications transmitter operating over a frequency band of 7.9 to 8.4 GHz. The transmitter 10 of FIG. 1 includes a modulator 12 which provides an output modulated signal at a frequency of 70 MHz.

Oscillator 28 is a stable oscillator whose output signal is provided to an intermediate frequency local oscillator 30 and to a frequency synthesizer 50 for providing a frequency standard for the output signals generated by these devices. Stable oscillator 28 may, for example, be a very accurate crystal oscillator or, preferably, a cesium standard oscillator. The 70 MHz modulated signal from modulator 12 is provided to a first mixer 14 wherein the signal undergoes a frequency conversion by use of the 630 MHz output signal from IF local oscillator 30 to provide an intermediate frequency signal at 700 MHz. The intermediate frequency signal is filtered in bandpass filter 16, which selects the sum frequency output from mixer 14, and is amplified by amplifier 18 and provided to second mixer 20. In second mixer 20 the intermediate frequency signal is mixed with the output from the RF local oscillator 32 to generate the RF signal to be transmitted. This RF signal is again filtered in filter 22 and amplified in transmitting amplifier 24 before being supplied to the transmitting antenna 26. This transmitter scheme provides a stable frequency transmitting signal and facilitates signal detection by the use of a similar stable oscillator.

Tuning of the transmit frequency is accomplished by varying the RF local oscillator to the desired transmit frequency allowing for the IF offset frequency.

Figure 2:
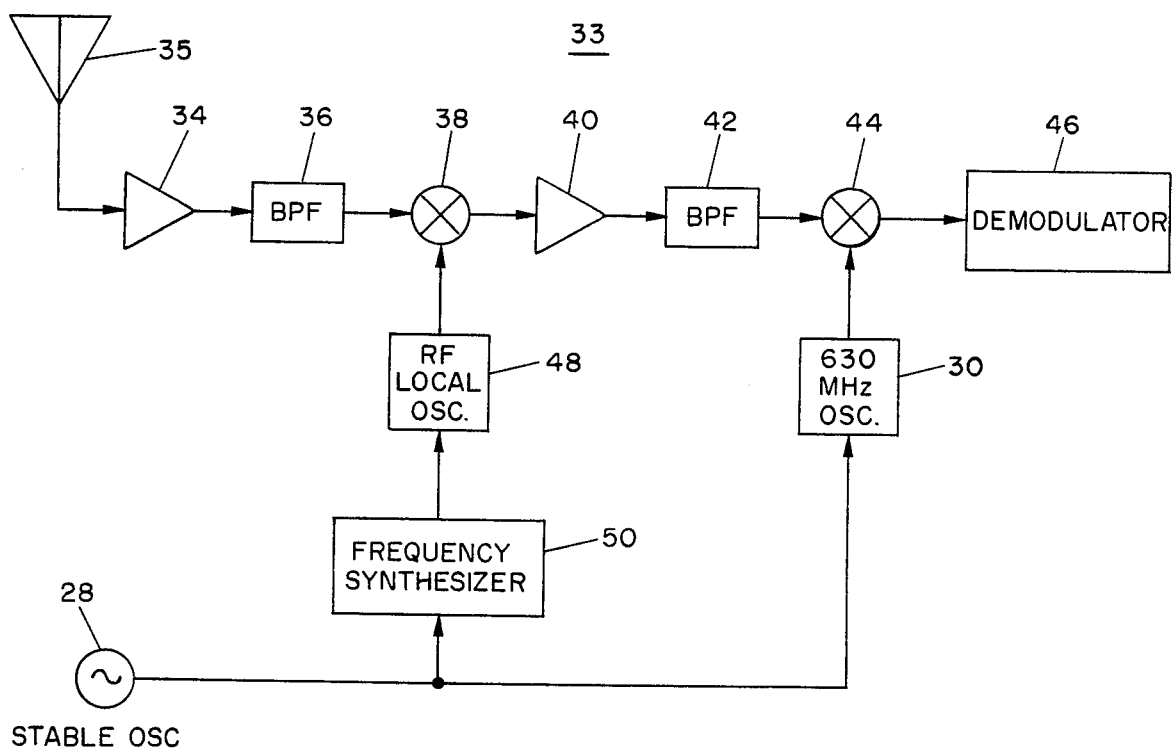
FIG. 2 is a schematic and block diagram of a receiver using an RF local oscillator.

FIG. 2 is a schematic and block diagram of a receiver 33 usable in a system having the transmitter 10 of FIG. 1. Receiver 33 of FIG. 2 includes a receiving antenna 35, a low noise preamplifier 34 and filter 36 for selecting the frequencies to be received. There is also provided a first mixer 38 for converting the received signal to an intermediate frequency of 700 MHz by the use of RF local oscillator 48. In connection with the receiver 33 shown in FIG. 2, it should be noted that the received frequency band at 7.25 to 7.75 GHz is different from the transmitted frequency band because of a frequency translation which takes place in a satellite upon relaying of a signal. The 700 MHz IF signal is amplified, filtered and mixed in mixer 44 with a signal supplied by intermediate frequency local oscillator 30. The signal is converted to a 70 MHz signal which is provided to a demodulator 46. A frequency selectable RF local oscillator 48 is provided as a local oscillator to mixer 38. The IF local oscillator and the frequency synthesizer are provided with a frequency reference signal from a stable oscillator 28 similar or identical to the stable oscillator used in the transmitter 10. Tuning of the receiver frequency is accomplished by varying the RF local oscillator to the desired receive frequency allowing for the IF offset frequency.

Figure 3:
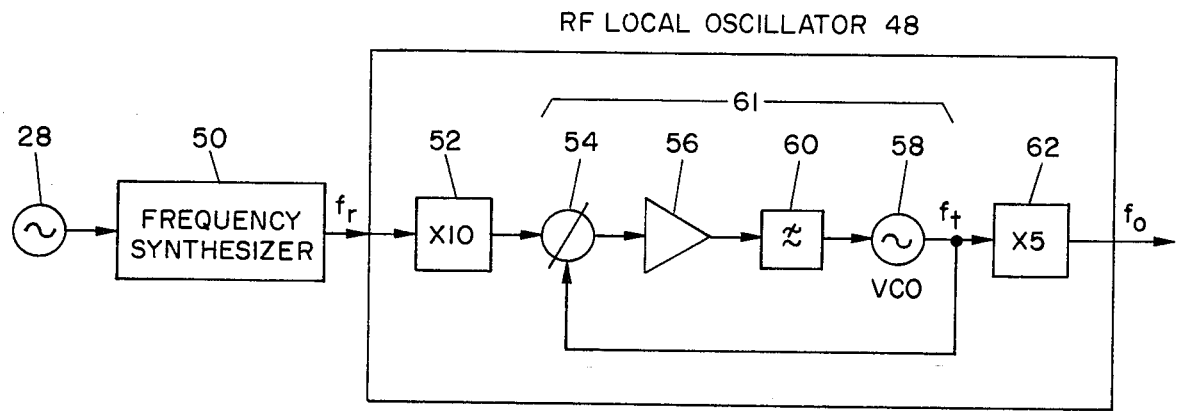
FIG. 3 is a schematic and block diagram of a prior art RF local oscillator.

FIG. 3 is a block diagram of a prior art RF local oscillator 48. The RF local oscillator 48 specifically illustrated in FIG. 3 is the local oscillator 48 which is used in the receiver 33 of FIG. 2. The signal from stable oscillator 28 is provided to a frequency synthesizer 50. The frequency synthesizer 50 is a digitally controlled device, which responds to the signal from the stable oscillator and through a series of counting and/or dividing circuits generates a reference signal which has a selectable frequency within a frequency band of 130 to 160 MHz. When used to supply an input reference signal for the prior art RF local oscillator 32 of FIG. 1 in a transmitter 10, synthesizer output signals in the band of 144 to 154 MHz are utilized. When used to supply an input reference signal for the prior art RF local oscillator 48 of FIG. 2 in a receiver 33, only the band of 131 to 141 MHz is utilized. The reference frequency is selectable in 20 Hz steps.

Referring to FIG. 3, the output signal from frequency synthesizer 50 is provided to a 10 times multiplier 52, whose output is provided to phase detector 54. A voltage controlled oscillator (VCO) 58 is provided, operating at a frequency ft which is 10 times the frequency fr of the reference signal from synthesizer 50. Oscillator 58 is arranged in a phase locked loop 61, which includes filter 60, phase detector 54, and amplifier 56. The signal which is generated by oscillator 58 is provided to a 5 times multiplier 62, whose output is at the desired local oscillator frequency fo, and is selectable in steps of 1000 Hz, because of the times 50 frequency multiplication between the frequency synthesizer 50 and the output.

In the usual prior art arrangement voltage controlled oscillator 58 utilizes a very high Q cavity reasonator, which is designed to obtain low phase noise on the VCO output signal. The use of such a high Q oscillator necessitates that the oscillator be mechanically tunable, so that whenever the frequency output from frequency synthesizer 50 is changed, a mechanical adjustment must be manually made to the oscillator.

For the purpose of this description reference will be made to two types of phase variations. Random phase noise will refer to the typically encountered stationary process phase noise associated with oscillators, amplifiers, and other electronic devices. The term "transient phase disturbances" will refer to fluctuations in the phase of a sinusoidal signal which are intermittent in nature.

When a system which uses the local oscillator 48 illustrated in FIG. 3 is used with a modulator providing a digital phase shift keyed signal, difficulties arise by reason of transient phase disturbances in the RF local oscillator signal. One source of the transient phase disturbances is the high Q mechanically tuned cavity resonator employed in VCO 58, which can generate phase noise by reason of microphonics, that is, mechanical vibrations in the oscillator structure arising out of shock or vibration incident thereon. The microphonics problem in VCO 58 can be suppressed by providing a wider bandwidth for the phase lock loop 61. For example, when used in a system using phase shift key modulation, phase lock loop 61 may have a bandwidth of 50 KHz. Increasing the bandwidth of phase lock loop 61 results in a large amount of random phase noise and transient phase disturbances in the output signal as a result of random or transient phase disturbances originating in frequency synthesizer 50. The transient phase disturbances may originate from the frequency synthesizer power supply, thermal stress, poor connections, vibrations, electro-magnetic interference (EMI), or other sources. These phase disturbances may be of small magnitude in the signal which is output from the frequency synthesizer, but the fact that the RF local oscillator signal is derived by frequency multiplying the frequency synthesizer signal by a factor of 50 can cause substantial phase disturbances in the RF local oscillator signal. In essence, the factor of 50, by which the signal undergoes a frequency multiplication, results in a times 50 multiplication of the phase noise or transient phase disturbances. The phase disturbances are not particularly harmful in connection with frequency modulation transmissions, but can result in errors in the receiver, when used with a phase shift key modulation scheme.

DESCRIPTION OF THE INVENTION

Figure 4:
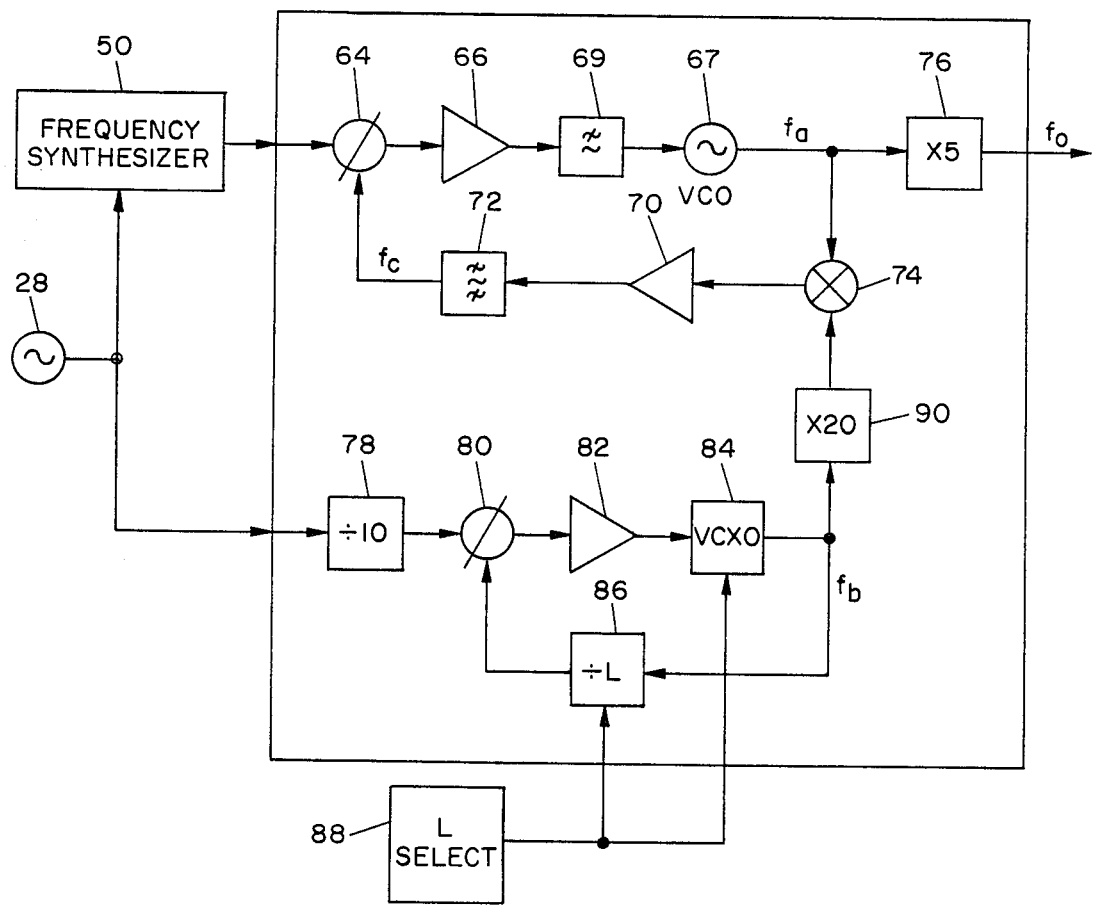
FIG. 4 is a schematic and block diagram of a preferred embodiment of an RF local oscillator in accordance with the present invention.

FIG. 4 is a schematic and block diagram of an RF local oscillator 63 in accordance with a preferred embodiment of the present invention. Oscillator 63 can directly replace oscillator 48 and provide substantial improvement in random phase noise and transient phase disturbances in the local oscillator signal. Accordingly, the system can be more easily used in connection with a phase shift keyed communication system. In essence the arrangement shown in FIG. 4 provides an RF local oscillator 63 which converts the output of the frequency synthesizer 50 into an RF local oscillator signal without the use of 10 times multiplier 52 in FIG. 3, whereby the amount of random phase noise and transient phase disturbance in the RF local oscillator signal is substantially reduced.

The RF local oscillator 63 shown in FIG. 4 responds to a reference signal provided by frequency synthesizer 50, which is identical to the frequency synthesizer 50 used in connection with the prior art RF local oscillator 48 shown in FIG. 3. The frequency synthesizer provides an output signal with a selectable frequency in the range 130 to 150 MHz, in steps of 20 Hz. As in the prior art arrangement the frequency synthesizer is phase locked to a stable oscillator 28.

Rather than provide a 10 times multiplier 52 for the output of the frequency synthesizer, the RF local oscillator 63 shown in FIG. 4 makes use of a phase locked loop of a special arrangment in order to convert the frequency output of the frequency synthesizer to a higher intermediate frequency fa. The phase lock loop is provided with a voltage controlled oscillator 67 which operates at a frequency of approximately 10 times the frequency of the frequency synthesizer output. The system 63 of FIG. 4 includes an arrangement for providing a phase stable signal fb, which is multiplied in multiplier 90, and then mixed with the output of voltage controlled oscillator 67 in mixer 74 to provide a feedback signal fc at the same frequency as the frequency synthesizer output.

The phase stable signal fb is generated by a voltage controlled crystal oscillator 84 which is phase locked to stable oscillator 28 by a separate phase locked loop. As an example, the 10 MHz frequency output from stable oscillator 28 is provided to a frequency divider 78 which provides an output reference signal at 1 MHz. This signal is provided to phase detector 80 in the phase locked loop which includes the voltage controlled crystal oscillator 84. The output of voltage controlled crystal oscillator 84 is provided to a dividing circuit 86 which divides the output frequency by a number L to result in a signal at a frequency of 1 MHz to be compared with the 1 MHz reference signal which is output from frequency divider 78, in phase detector 80.

Voltage controlled crystal oscillator 84 is of a special design for providing a set of selectable frequencies, each of which are integral multiples of the reference frequency provided by frequency divider 78. For example, in one embodiment, the frequency of the voltage controlled crystal oscillator is selectable from 59 to 63 MHz in one MHz steps. It is appropriate to provide multiple crystals, one for each of these frequencies to be selected in accordance with a control signal provided by frequency selecting device 88. Frequency selecting device 88 also provides an appropriate control signal to frequency divider 86 so that the output of voltage controlled crystal oscillator 84 is appropriately divided to provide a signal to phase detector 80 of the same frequency as provided by divider 78. The use of a voltage controlled crystal oscillator phase locked to the stable oscillator 28 provides a system for generating an extremely low phase noise signal with high frequency accuracy which can be mixed with the output from voltage controlled oscillator 67 in the frequency conversion phase locked loop. The phase stable signal from voltage controlled crystal oscillator 84 is multiplied by a factor of 20 in frequency multiplier 90. The output of multiplier 90 is provided to mixer 74. The frequency supplied to mixer 74 from multiplier 90 is selectable between 1180 and 1260 MHz in steps of 20 Mhz due to the multiplication factor of 20. These 20 MHz steps correspond to the range of frequencies utilized from synthesizer 50.

The use of the frequency selectable phase stable oscillator allows the local oscillator 63 of the present invention to provide an identical frequency range of RF local oscillator output signals as oscillator 48, with the output frequencies selectable in smaller steps, and with a reduction of frequency multiplication of the synthesizer frequency by a factor of 10. For example, in the prior art arrangement of an RF local oscillator 48 which is illustrated in FIG. 3, the frequency synthesizer has an output frequency range of 10 MHz in 20 Hz steps. This output frequency range is subjected to a times 50 multiplication so that the 10 MHz frequency range of the output of frequency synthesizer 50 becomes a 500 MHz frequency range at the output of multiplier 62. In the RF local oscillator 63 according to the present invention, the output of frequency synthesizer 50 undergoes a times 5 multiplication in multiplier 76. Accordingly, frequency synthesizer 50 provides a frequency variation of 100 MHz in the RF local oscillator output signal. Because there are 5 selectable frequencies in voltage controlled crystal oscillator 84, which at the output of multiplier 90 are separated in frequency by 20 MHz, and subjected to a 5 times multiplication, it therefore becomes possible to get the same RF frequency band of 500 MHz at the output of multiplier 76. The frequency difference separating the available selectable signals at the output of the frequency multiplier 90 corresponds to the utilized frequency range of the output of frequency synthesizer 50. It therefore is possible to develop signals at the output of multiplier 76 which are selectable in steps of 100 Hz (5×20 Hz) over a 500 MHz (20 MHz×5×5) frequency range by providing variable control signals to frequency synthesizer 50, voltage controlled crystal oscillator 84 and frequency divider 86.

The RF local oscillator 63 according to the invention, as illustrated in FIG. 4, has a particular advantage with respect to the level of random phase noise as compared to the prior art local oscillator 48 of FIG. 3. In the prior art oscillator 48 as shown in FIG. 3 any random phase noise which originates in frequency synthesizer 50 is multiplied by a factor of 50 in multipliers 52 and 62 before being provided as an RF output signal. This multiplication, as previously noted, can result in a relatively high level of random phase noise, which may cause receiver ambiguities in detection of a phase shift key modulation signal. This phase noise can originate in the local oscillator at either the transmitter or receiver, and can cause phase anomalies in the detection of the signal. In the RF local oscillator according to the present invention, as illustrated in FIG. 4, the level of random phase noise is substantially reduced because the output signal from the frequency synthesizer is subjected to a multiplication by only a factor of 5. This multiplication by a factor of 5, rather than a factor of 50, results in a reduction in random phase noise by a factor of 10 over a large part of the Fourier frequency range. In substitution for the multiplication by a factor of 10, the embodiment of the invention illustrated in FIG. 4 provides for change in frequency of the signal supplied by the synthesizer 50 by mixing the signal in a phase lock loop arrangement with a signal provided by a phase stable oscillator, consisting of the voltage controlled crystal oscillator 84 in conjunction with its associated phase locked loop and multiplier 90. The voltage controlled crystal oscillator 84 provides an extremely phase stable signal which, even when multiplied by a factor of 20 in multiplier 90, provides a signal to mixer 74 of substantial phase stability.

Figure 5:
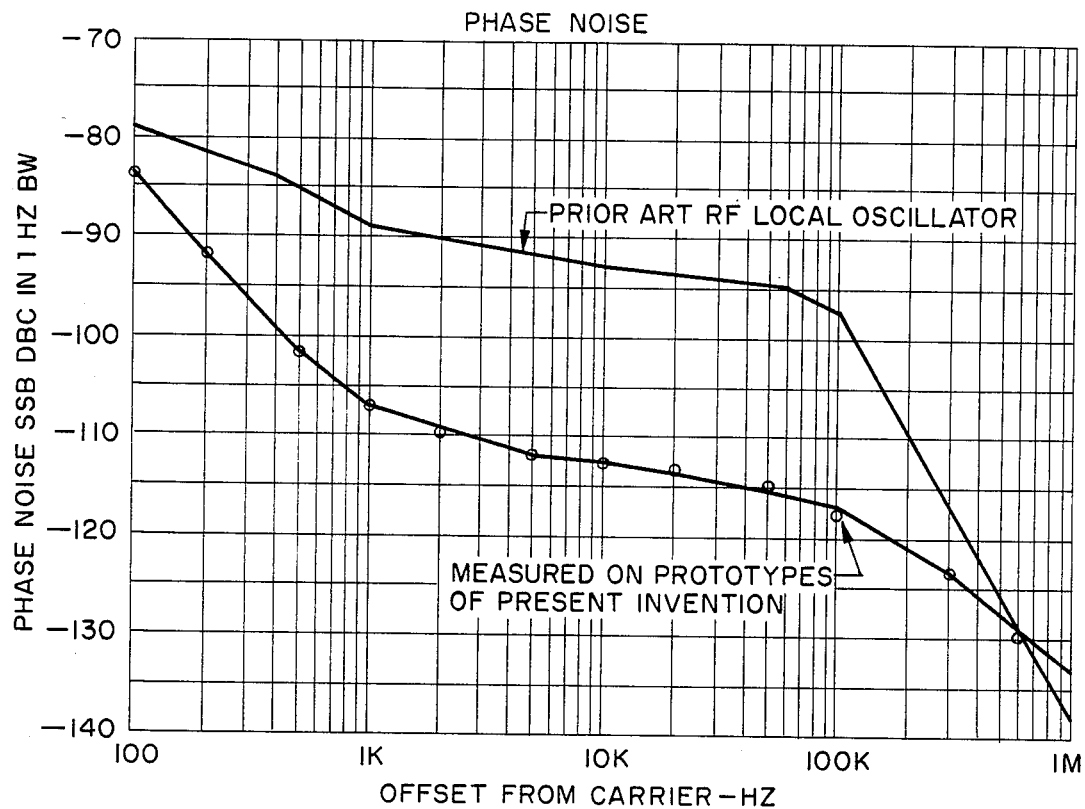
FIG. 5 is a graph illustrating phase noise as a function of frequency offset, comparing the present invention to prior art RF local oscillators.

FIG. 5 illustrates the reduction in random phase noise achieved by the present invention compared to prior art as measured on two prototypes constructed in accordance with the preferred embodiment. The vertical scale represents single sideband random phase noise power as measured in a 1 Hz bandwidth compared to the power of the RF local oscillator output signal. The horizontal scale represents Fourier frequency displacement from the carrier.

Figure 6:
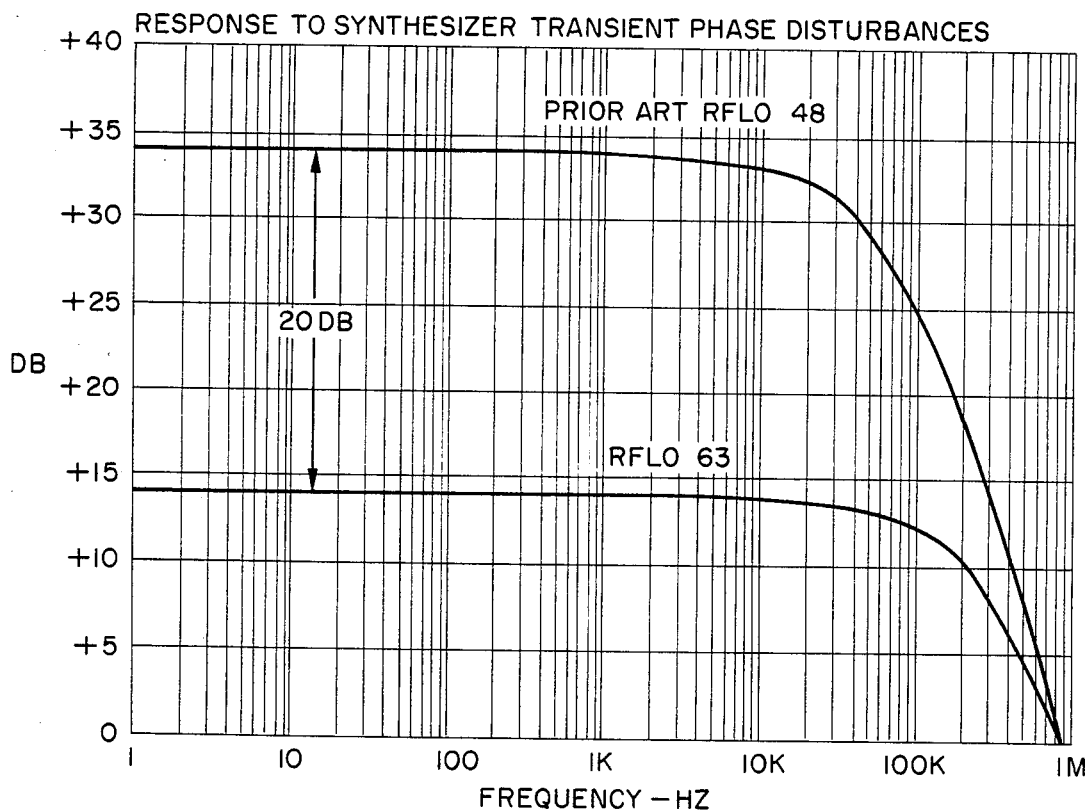
FIG. 6 is a graph illustrating the response of RF local oscillators to transient phase disturbances, comparing the present invention to the prior art.

FIG. 6 illustrates the RF local oscillator response to synthesizer transient phase disturbances as measured on a prior art RF local oscillator and prototypes of a RF local oscillator constructed in accordance with the preferred embodiment of the present invention.

The measurements represented by FIG. 6 were made by inducing a transient phase disturbance within the circuitry of the synthesizer so as to produce a corresponding transient phase distrubance of a known magnitude at the synthesizer output. The resultant transient phase disturbance at the output of the RF local oscillator was then measured and compared to the known level of the synthesizer transient phase disturbance.

The vertical scale represents 20 times the logarithm of the ratio of the magnitude of the transient phase disturbance at the output of the RF local oscillator to the magnitude of the transient phase disturbance at the RF local oscillator input. The horizontal scale represents the Fourier frequency of the induced phase disturbance.

Table I illustrates the range of frequencies which is available in accordance with the arrangement of the RF local oscillator 63 illustrated in FIG. 4. Table II shows a corresponding range when the same arrangement of the RF local oscillator 63 illustrated in FIG. 4 is used for a transmitter RF local oscillator.

A further advantage of the present invention is that it permits the use of a broadband microstrip or stripline oscillator to be used as the VCO, rather than a cavity oscillator. This is of importance, because it eliminates the manual tuning normally required when changing frequencies using a cavity oscillator. Elimination of the manual tuning requirement permits remote computer control of the RF oscillator frequency. This is particularly advantageous in satellite communication earth stations. Also the microstrip or stripline voltage controlled oscillators are much less prone to transient phase disturbances because of their simpler construction.

Stripline and microstrip voltage controlled oscillators may be used in the present invention because of the phase noise reduction of approximately 20 dB on the reference signal applied to the phase detector 64 in the RFLO in the present invention compared to the signal applied to phase detector 54 of the prior RFLO of FIG. 3. This eliminates the requirement for a high Q factor cavity oscillator for obtaining good random phase noise performance.

It should be noted that the foregoing embodiment of the invention is exemplary only and those skilled in the art will realize that many variations of the invention are possible in accordance with the requirements of a particular application. In particular, it is necessary to adapt the specific frequencies of the various components to the bandwidth and tuning requirements of a particular application. The oscillator 63 of FIG. 4 may also be configured with other or different frequency multipliers and dividers, such as the inclusion of a frequency multiplier and/or divider between synthesizer 50 and phase detector 64. It should also be noted that oscillator 84 may be a single frequency oscillator, and may operate at a frequency which enables elimination of multiplier 90. Likewise, appropriate frequency multiplication between stable oscillator 28 and phase detector 80 may eliminate the need for frequency divider 86.

In the embodiment illustrated, stable oscillator 28, which is preferably a cesium standard oscillator, is used as a frequency standard for both frequency synthesizer 50 and phase stable oscillator 84. This is done to assure frequency stability of the RF local oscillator output signal. The phase stable oscillator need not be phase locked to a standard if its drift is within allowable system parameters.

In the illustrated embodiment 63 it should be noted that the times 5 multiplication, used as an alternate to the times 50 multiplication of the prior art oscillator 48, provides a lower range of output frequencies than the prior device, given the same range of frequencies available from synthesizer 50. The illustrated embodiment compensates by using a larger range of outputs of the frequency synthesizer (20 MHz range, rather than 10 MHz range) and also by providing 5 selectable signal frequencies from the phase stable oscillator. By this combination of measures the full 500 MHz bandwidth is obtained. It will be recognized by those familar with the art that these measures are subject to modification and/or tradeoff. Thus, increased range of phase stable oscillator frequencies can be traded for lower range of frequencies from the synthesizer 50, or vice-versa.

It should be understood that the multipliers and dividers used in the present invention need not be integral multipliers and dividers as illustrated, and may in fact be multiplier/divider combinations according to the needs of the particular system and the parameters around which the design engineer must work.

While there have been described what is believed to be the preferred embodiment of the present invention, those skilled in the art will recognize that other, and further modifications, may be had thereto, without departure from the spirit of the present invention, and it is intended to claim all such embodiments as fall within the true scope of the invention.

TABLE I

| Synthesizer | L | $f_d$ | $f_a$ | Output Fo |
|---|---|---|---|---|
| 130–150 MHz | 59 | 1180 MHz | 1310–1330 MHz | 6550–6650 MHz |
| 130–150 | 60 | 1200 | 1330–1350 | 6650–6750 |

TABLE I-continued

| Synthesizer | L | $f_d$ | $f_a$ | Output Fo |
|---|---|---|---|---|
| 130–150 | 61 | 1220 | 1350–1370 | 6750–6850 |
| 130–150 | 62 | 1240 | 1370–1390 | 6850–6950 |
| 130–150 | 63 | 1260 | 1390–1410 | 6950–7050 |

TABLE II

| Synthesizer | L | $f_d$ | $f_a$ | Output Fo |
|---|---|---|---|---|
| 140–160 MHz | 65 | 1300 MHz | 1440–1460 MHz | 7200–7300 MHz |
| 140–160 | 66 | 1320 | 1460–1480 | 7300–7400 |
| 140–160 | 67 | 1340 | 1480–1500 | 7400–7500 |
| 140–160 | 68 | 1360 | 1500–1520 | 7500–7600 |
| 140–160 | 69 | 1380 | 1520–1540 | 7600–7700 |

We claim:

1. An RF local oscillator, responsive to a supplied reference signal for providing a signal at a desired selectable frequency, higher than the frequency of said reference signal and dependent on said reference signal frequency, comprising:
   a phase stable crystal oscillator having a plurality of selectable crystals each for oscillating at a selected frequency, for providing a phase stable output signal at one of said selected frequencies which is separated from said desired higher frequency by the frequency of said reference signal;
   a voltage controlled oscillator operating at said desired higher frequency; and
   a phase locked loop having mixers coupled to receive said reference signal and said phase stable output signal, and including said voltage controlled oscillator, for controlling the output of said voltage controlled oscillator thereby to develop said signal at said desired frequency.

2. An RF local oscillator as specified in claim 1 wherein said reference signal is derived from a frequency stable oscillator, and wherein said phase stable oscillator is frequency locked to said frequency stable oscillator.

3. An RF local oscillator as specified in claim 1 wherein there is further provided a frequency multiplier responsive to the output of said voltage controlled oscillator for further increasing the frequency of said signal.

4. An RF local oscillator responsive to a supplied reference signal, derived from a frequency stable oscillator, for providing an output signal at a desired selectable frequency, higher than the frequency of said reference signal and dependent on said reference signal frequency, comprising:
   (1) a phase stable oscillator for providing a selectable frequency phase stable output signal having a frequency which is separated from said desired higher frequency by the frequency of said reference signal, said phase stable oscillator including:
      (a) a voltage controlled crystal oscillator having a plurality of selectable crystal frequencies having a selected frequency separation;
      (b) means for providing a phase stable oscillator reference signal having a frequency derived from said frequency stable oscillator;
      (c) a first frequency divider for frequency dividing the output signal of said crystal oscillator and having a plurality of selectable division ratios, corresponding in number to said plurality of crystal frequencies, for providing a signal having a frequency corresponding to the frequency of said phase stable ocillator reference signal;

(d) a phase detector and amplifier responsive to the output signal of said first divider and said phase stable oscillator reference signal for generating a phase lock loop control signal for said crystal oscillator;

(2) a voltage controlled oscillator operating at said desired higher frequency; and (3) a phase locked loop having mixers coupled to receive said reference signal and said phase stable output signal, and including said voltage controlled oscillator, for controlling the output of said voltage controlled oscillator thereby to develop said signal at said desired higher frequency.

5. An RF local oscillator as specified in claim 4 wherein said phase stable oscillator further includes at least one multiplier circuit responsive to the output of said voltage controlled crystal oscillator.

6. An RF local oscillator as specified in claim 4 wherein there is further provided a frequency multiplier responsive to the output of said voltage controlled oscillator for further increasing the frequency of said output signal.

7. An RF local oscillator as specified in claim 4 wherein said means for providing a phase stable oscillator reference signal comprises a second frequency divider for dividing the frequency of the output signal of said frequency stable oscillator.

8. A frequency and phase stable local oscillator, for providing an RF signal having a frequency which is selectable in first discrete frequency increments over a selected RF frequency band in response to a reference signal derived from a frequency stable oscillator, said reference signal having a frequency which is selectable within a second frequency band in second discrete frequency increments, said second frequency band being a sub-multiple, $/(N \times M)$ of said RF frequency band and said second frequency increments being sub-multiples $1/N$ of said first frequency increments, comprising:

(a) a phase stable, frequency selectable oscillator having a number M of output frequencies, said output frequencies being separated by a frequency difference corresponding to said second frequency band, said oscillator including:

a voltage-controlled, frequency selectable crystal oscillator, having M selectable frequencies, each a sub-multiple $1/P$ of said output frequencies and separated by a frequency separation which is a sub-multiple $1/P$ of said frequency difference;

a first frequency divider, responsive to said frequency stable oscillator for deriving therefrom a signal having a frequency which is equal to said frequency separation of said voltage controlled crystal oscillator frequencies;

a second frequency divider, responsive to the output of said crystal oscillator and having selectable division ratios corresponding to the ratio of said crystal oscillator frequencies to the output of said first frequency divider;

a first phase detector, responsive to the outputs of said first and second frequency dividers for supplying a first control signal to said voltage controlled crystal oscillator;

and first frequency multiplying means, having a multiplication ratio P responsive to the output of said crystal oscillator;

(b) a voltage controlled oscillator, responsive to a second control signal;

(c) a frequency mixer, responsive to the output of said voltage controlled oscillator and the output of said first frequency multiplying means, for deriving a feedback signal;

(d) a second phase detector, responsive to said feedback signal and said reference signal for supplying said second control signal; and (e) second multiplying means, having a multiplication ratio N, responsive to the outout of said voltage controlled oscillator and providing said RF signal.

* * * * *

UNITED STATES PATENT AND TRADEMARK OFFICE
CERTIFICATE OF CORRECTION

PATENT NO. : 4,551,689
DATED : November 5, 1985
INVENTOR(S) : John Scala et al.

It is certified that error appears in the above-identified patent and that said Letters Patent is hereby corrected as shown below:

Col. 1, line 33, "and" should read --an--.
Col. 6, line 39, "distrubance" should read --disturbance--
Col. 7, line 66, and Col. 8, line 10, "$f_d$" and "$f_a$" should read --Fd-- and --Fa--.
Col. 9, line 2, "ocillator" should read --oscillator--;
    line 38, "/(NxM)" should read --1/N x M)--.
Col. 10, line 38, "outout" should read --output--.

Signed and Sealed this

Fourth Day of November, 1986

[SEAL]

Attest:

DONALD J. QUIGG

Attesting Officer    Commissioner of Patents and Trademarks